United States Patent [19]

Tanizawa

[11] Patent Number: 4,682,202
[45] Date of Patent: Jul. 21, 1987

[54] MASTER SLICE IC DEVICE

[75] Inventor: Tetsu Tanizawa, Kawasaki, Japan

[73] Assignee: Fujitsu Limited, Kanagawa, Japan

[21] Appl. No.: 635,680

[22] Filed: Jul. 30, 1984

[30] Foreign Application Priority Data

Jul. 29, 1983 [JP] Japan ................................. 58-137698

[51] Int. Cl.[4] ...................... H01L 27/10; H01L 29/70; H01L 29/78
[52] U.S. Cl. ........................................ 357/45; 357/41; 357/42; 357/43
[58] Field of Search ......................... 357/41, 42, 43, 45

[56] References Cited

U.S. PATENT DOCUMENTS 3,609,479  9/1971  Lin et al. ................................. 357/43
4,412,237 10/1983  Matsumura et al. ................... 357/41

FOREIGN PATENT DOCUMENTS 80361    6/1983  European Pat. Off. .............. 357/45
125504  11/1984  European Pat. Off. .............. 357/45
57-181152 11/1982  Japan ................................... 357/45
58-71650   4/1983  Japan ................................... 357/41
58-56354   4/1983  Japan ................................... 357/45
58-85558   5/1983  Japan ................................... 357/45

2122417  1/1984  United Kingdom .

OTHER PUBLICATIONS

Carballo et al., "Self-Contained Bipolar-FET-Device", IBM Tech. Discl. Bull., vol. 19, No. 11, Apr. 1977, pp. 4191–4192.

Primary Examiner—Andrew J. James
Assistant Examiner—Jerome Jackson
Attorney, Agent, or Firm—Armstrong, Nikaido, Marmelstein & Kubovcik

[57] ABSTRACT

A master slice IC device comprising at least two kind of basic cells; that is, a first kind of basic cells each having one or more n-type MIS transistors and one or more p-type MIS transistors to form a CMIS logic circuit, and a second kind of basic cells each comprising an npn-type bipolar transistor and a pnp-type bipolar transistor to form a bipolar buffer circuit having a large drive ability. The second kind of basic cells are used, for example, only when the fan-out number is large and/or the length of the connection lines is long, thereby realizing a high degree of freedom in circuit design and a high operating speed without increasing the power consumption.

9 Claims, 15 Drawing Figures

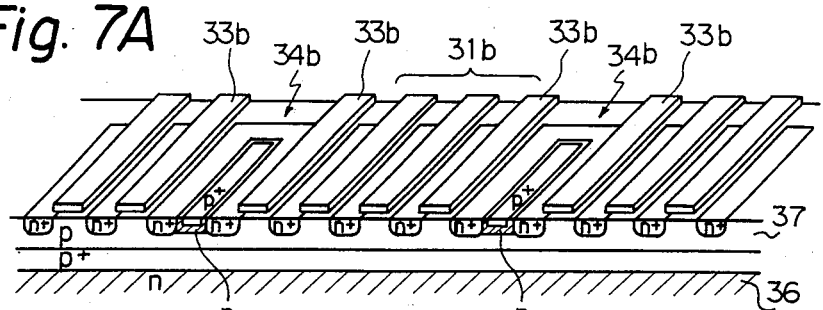
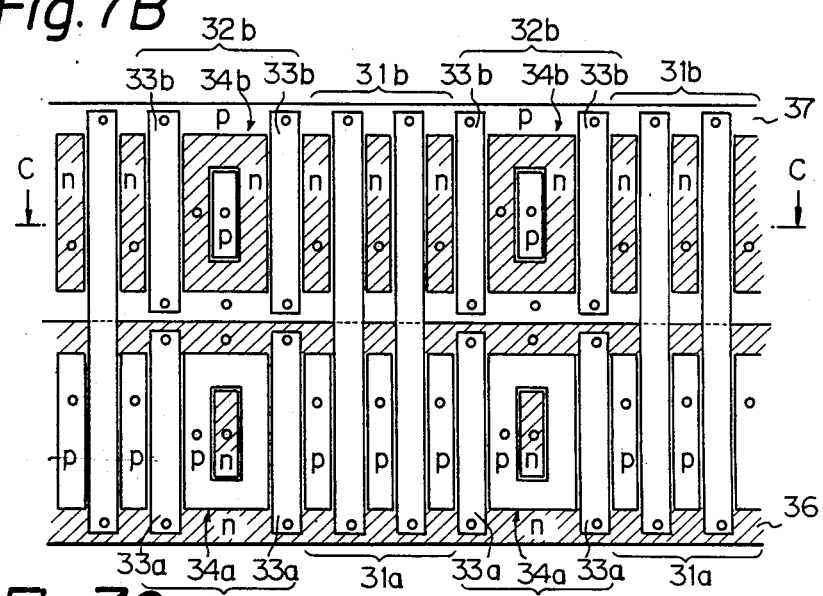
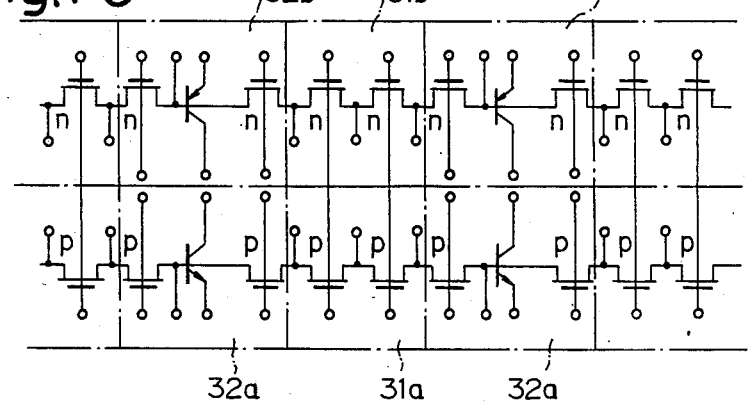

MASTER SLICE IC DEVICE

BACKGROUND OF THE INVENTION (1) Field of the Invention

The present invention relates to a master slice integrated circuit device, more particularly to a master slice IC device or a gate array LSI device which comprises a plurality of inner cell kinds having different drive ability thereby allowing a higher degree of freedom in the circuit design.

(2) Description of the Prior Art

In a gate array LSI device, input/output cells and basic cells are disposed on predetermined positions of a semiconductor chip. The gate array LSI device is fabricated by interconnecting these cells through connection patterns designed on the basis of a circuit diagram proposed by a customer. Therefore, the manner of connection between each cell, quality, and performance requirement, and so on, differ for each customer. Thus, it is necessary that each cell of the gate array LSI device has the required high performance and a high degree of freedom in the circuit design.

In an inner cell array of a conventional gate array LSI device, only one kind of basic cell, all having the same drive ability, is used. Therefore, the operating speed of each circuit varies greatly in accordance with the lengths of the connection lines connected to each basic cell, and the number of fan-outs of each basic cell is limited to that under or equal to a predetermined number; making it impossible to increase the degree of freedom in the circuit design. On the other hand, in order to increase the degree of freedom in the circuit design, the drive ability of the output circuits of all the basic cells is made larger, the area occupied by each basic cell also becomes larger, decreasing the degree of integration and increasing the power consumption of the device.

SUMMARY OF THE INVENTION

In view of the above-mentioned problems of the conventional device, the present invention adopts an idea of disposing a plurality of basic cell kinds having different drive ability in an inner cell array of a master slice integrated circuit device.

It is an object of the present invention to increase the degree of freedom in the circuit design of a master slice LSI device, to increase the operating speed of each circuit therein, and to decrease the power consumption thereof, thereby obtaining a high performance LSI device.

BRIEF DESCRIPTION OF THE DRAWINGS

FIGS. 7A, 7B, and 7C are a partially sectional perspective view, plan view, and electric circuit diagram of a basic cell unit used in a gate array LSI device as another embodiment of the present invention;

DESCRIPTION OF THE PREFERRED EMBODIMENTS

Before describing the preferred embodiments, an explanation will be given of a conventional gate array LSI device.

Figure 1:
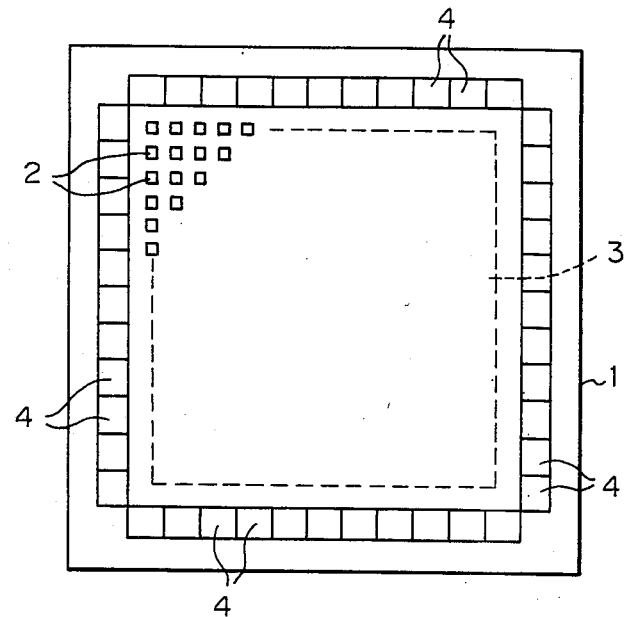
FIG. 1 is a plan view of the layout of each cell on a semiconductor chip of a conventional gate array LSI device.

FIG. 1 illustrates the layout of each cell on a semiconductor chip of a conventional gate array LSI device. As shown in FIG. 1, inner cells, i.e., basic cells 2 are arranged, for example, in a matrix on a semiconductor chip 1, forming an inner cell array 3. Input/output cells 4 are arranged surrounding the inner cell array 3.

It is possible to obtain an LSI device having a desired function by connecting the basic cells 2 and the input/output cells 4 thus arranged based on the design of a logic circuit proposed by a customer. In this case, circuits for realizing the desired function are formed by mutually combining the basic cells 2, and the input and output terminals of each of the circuits are connected to external circuits via the peripheral input/output cells 4.

However, as mentioned earlier, the conventional gate array LSI device is disadvantageous in that it has a low degree of freedom in circuit design, a low operating speed, and a high power consumption.

According to the present invention, there is provided a master slice IC device which overcomes these problems.

Figure 2:
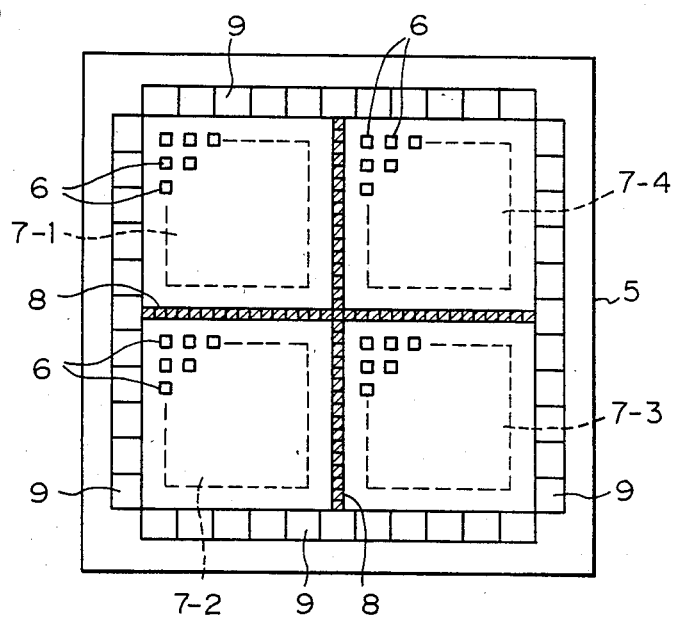
FIGS. 2 and 3 are plan views of the layout of each cell on a semiconductor chip of a gate array LSI device as an embodiment of the present invention.

FIG. 2 illustrates an arrangement of each cell on a semiconductor chip of a gate array LSI device as an embodiment of the present invention. In FIG. 2, four basic cell arrays 7-1, 7-2, 7-3, and 7-4 are formed, on a semiconductor chip 5, each comprising a first kind of basic cells 6 disposed, for example, in a matrix, a second kind of basic cells 8 disposed in the shape of a cross between the basic cell arrays 7-1, 7-2, 7-3, and 7-4, and input/output cells 9 disposed in an outer circumference of an inner cell area wherein these basic cells are disposed. Each of the first kind of basic cells 6 comprises an output stage having a relatively small drive ability, and each of the second kind of basic cells 8 comprises an output stage having a relatively large drive ability. The first kind of basic cells 6 are used for forming a circuit with a relatively small output fan-out number or a circuit with an output terminal connected to relatively short length connection lines. The second kind of basic cells 8 are used for forming a circuit with a large fan-out number, and a circuit with relatively long output connections. Thus it is possible to avoid the disadvantages of decreasing the operating speed of the circuit due to the increase in the fan-out number and/or in the length of the output connections, thereby deteriorating the operation reliability, and to enlarge the degree of freedom in the circuit design to attain a high performance LSI device. Since the second kind of basic cells 8 are disposed in a cross-shape, thus dividing the first kind of basic cells 6 into four blocks, i.e., four basic cell arrays 7-1, 7-2, 7-3, and 7-4, it is possible to connect between the basic cell arrays via the second kind of basic cells 8. In this way, the long connection lines connecting the basic cell arrays are driven via the basic cells having a larger drive ability, and it is possible to avoid the decrease in the operating speed of the circuit and to realize a high speed circuit.

Figure 3:
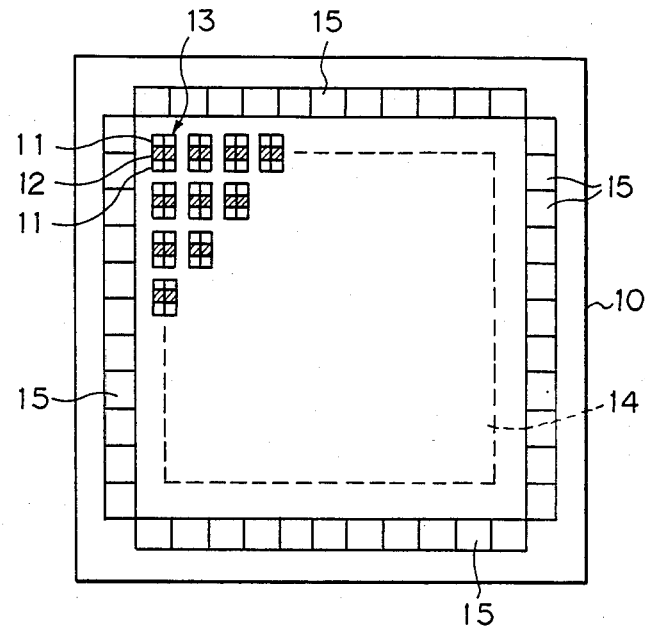

FIG. 3 illustrates an arrangement of each cell on a semiconductor chip of a gate array LSI device as another embodiment of the present invention. In FIG. 3, a basic cell array 14 is formed by a matrix arrangement of basic cell units 13 on a semiconductor chip 10. Each of the basic cell units 13 is a combination of four first kind of basic cells 11, each having a small drive ability, and two second kind of basic cells 12 each having a large drive ability. For example, in each basic cell unit 13, the first kind of basic cells 11 are disposed surrounding the second kind of basic cells 12. The input/output cells 15 are disposed along the outer circumference of the basic cell array 14.

In the device of FIG. 3, circuits with a large fan-out number and circuits with long output connection lines can be formed by using the second kind of basic cells 12. Other circuits can be formed by using the first kind of basic cells 11. Thus, the long connection lines in a semiconductor chip are driven by the basic cells 12 having a larger drive ability, making it possible to enlarge the operating speed of the circuits and to increase the degree of freedom in the circuit design.

Figures 4A, 4B:
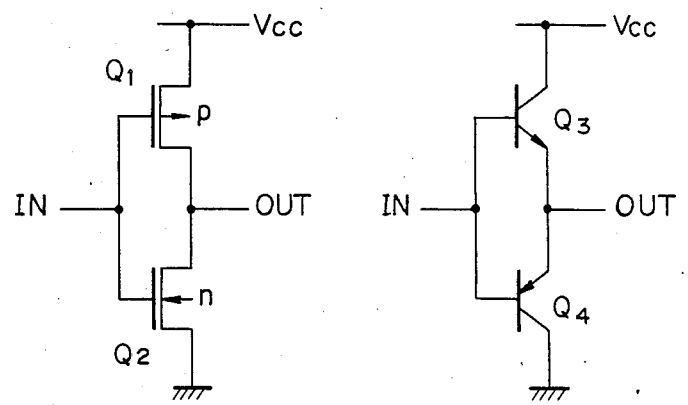
FIGS. 4A and 4B are electric circuit diagrams illustrating examples of basic cells used in the device shown in FIGS. 2 and 3.

FIGS. 4A and 4B illustrate the structures of the basic cells in the aforementioned embodiments. FIG. 4A illustrates a CMIS inverter circuit comprising a P-channel MIS transistor $Q_1$ and an n-channel MIS transistor $Q_2$. FIG. 4B illustrates a bipolar type buffer circuit comprising an NPN transistor $Q_3$ and a PNP transistor $Q_4$. In each of the aforementioned embodiments, the CMIS inverter of FIG. 4A or a CMIS type fundamental circuit having the output stage composed of the inverter circuit shown in FIG. 4A is used as a first kind of basic cell having a small drive ability, and the bipolar type buffer circuit shown in FIG. 4B can be used as a second kind of basic cell having a larger drive ability, or as the output stage of the second kind of basic cell.

In each of the aforementioned embodiments, it is possible to arrange, for example, only a buffer circuit or driver having a large drive ability in the portion of each second kind of basic cell and to connect the output of each first kind of basic cell to another circuit via the driver.

Figure 5C:
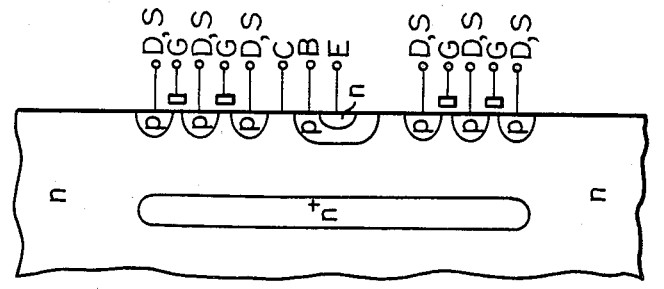
FIGS. 5B and 5C are sectional views taken on lines A—A and B—B of FIG. 5A, respectively.
Figure 5A:
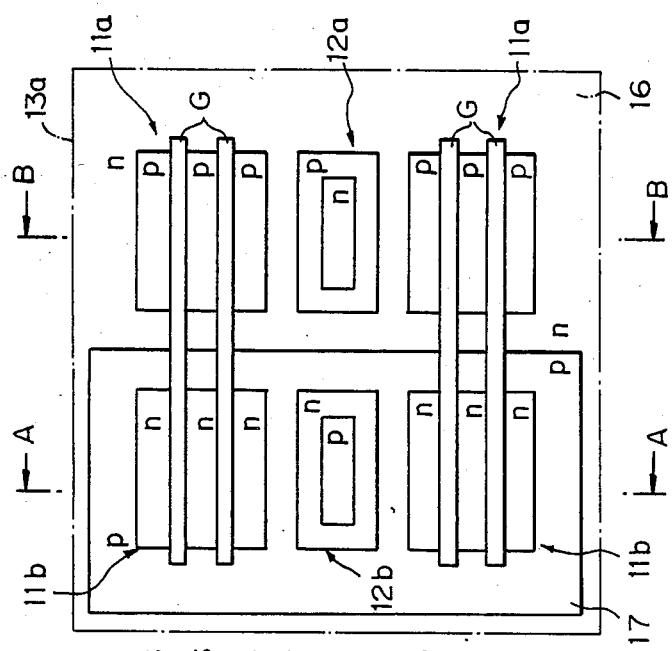
FIG. 5A is a plan view of a structure of a basic cell unit used in the device shown in FIG. 3.
Figure 5B:
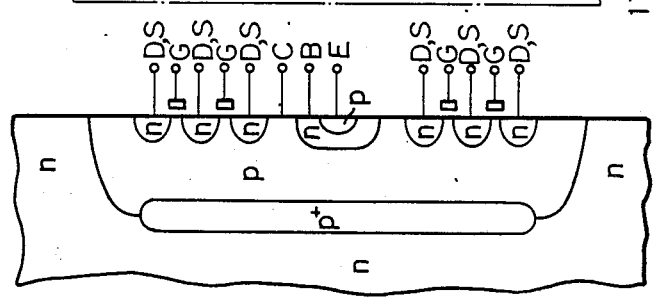

FIGS. 5A, 5B, and 5C illustrate an example of a detailed structure of the basic cell unit 13 in the gate array LSI device of FIG. 3, in FIG. 5A by a plan view and in FIGS. 5B and 5C by sectional views taken on lines A—A and B—B of FIG. 5A. The basic cell unit 13 comprises, for example, the first kind of basic cells 11a and 11b, and the second kind of basic cells 12a and 12b formed on, for example, an n-type substrate 16 and on a p-type well 17 formed on the n-type substrate 16. Each of the first kind of basic cells 11a comprises three p-type diffusion layers each being a drain or source and two gate electrodes, so that two p-channel MIS transistors are formed. Each of the first kind of basic cells 11b comprises three n-type diffusion layers, each being a drain or source, and two gate electrodes which are common to those of the basic cell 11b, so that two n-channel MIS transistors are formed. By using these two basic cells 11a and 11b and by suitably connecting the electrodes thereof, it is possible to form, for example, the buffer circuit shown in FIG. 4A or various fundamental gate circuits. The second kind of basic cells 12a and 12b comprises a vertical npn-type bipolar transistor and a vertical pnp-type bipolar transistor, respectively. By using these transistors, it is possible to form, for example, the buffer circuit shown in FIG. 4B.

Figure 6:
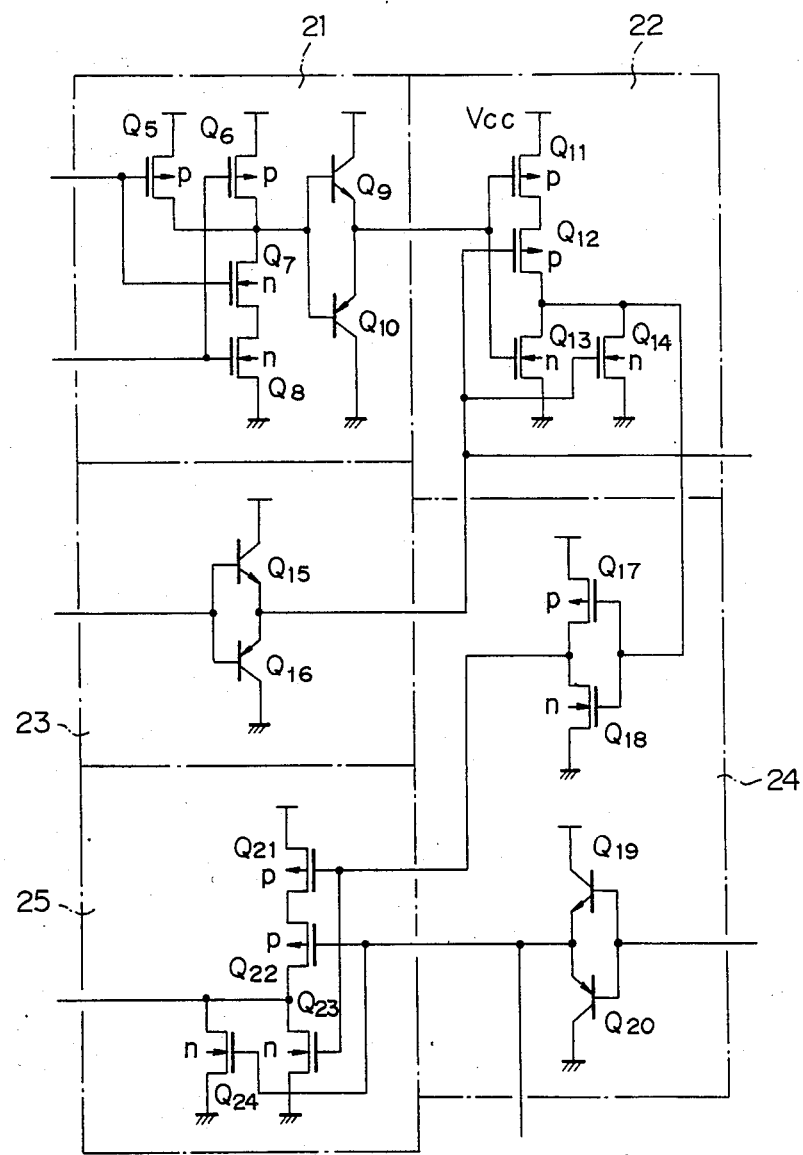
FIG. 6 is a circuit diagram of an electric circuit composed of a plurality of basic cell units as shown in FIG. 5A.

FIG. 6 illustrates a circuit composed by using the basic cell units as shown in FIGS. 5A, 5B and 5C. In FIG. 6, a basic cell unit 21 is used for forming a two-input MOS NAND gate and a bipolar buffer circuit. The two-input MOS NAND gate comprises two p-channel MOS transistors $Q_5$ and $Q_6$ formed by using the first kind of basic cell 11a, and two n-channel MOS transistors $Q_7$ and $Q_8$ formed by using the first kind of basic cell 11b. The bipolar buffer circuit comprises an npn-type transistor $Q_9$ and a pnp-type transistor $Q_{10}$ formed by using the second kind of basic cells 12a and 12b, respectively. Another basic cell unit 22 is used for forming a NR gate comprising two p-channel MOS transistors $Q_{11}$ and $Q_{12}$ and two n-channel MOS transistors $Q_{13}$ and $Q_{14}$, by using the first kind of basic cells 11a and 11b. In a basic cell unit 23, only the second kind of basic cells 12a and 12b are used to form a bipolar buffer comprising an npn-type transistor $Q_{15}$ and a pnp-type transistor $Q_{16}$. A basic cell unit 24 is used for forming a MOS inverter comprising a p-channel MOS transistor $Q_{17}$ and an n-channel MOS transistor $Q_{18}$, and a bipolar buffer comprising an npn-type transistor $Q_{19}$ and a pnp-type transistor $Q_{20}$. In the basic cell unit 24, both the first kind of basic cells 11a and 11b and the second kind of basic cells 12a and 12b are utilized. In a basic cell unit 25, a NOR gate comprising two p-channel MOS transistors $Q_{21}$ and $Q_{22}$ and two n-channel MS transistor $Q_{23}$ and $Q_{24}$ is formed by using the first kind of basic cells 11a and 11b.

FIGS. 7A, 7B, and 7C illustrate a basic cell unit used in a gate array LSI device as another embodiment of the present invention. FIG. 7B is a plan view and FIG. 7A is a partially sectional perspective view taken on line C—C of FIG. 7B. FIG. 7C illustrates an equivalent circuit of the basic cell unit. The basic cell unit shown in these drawings comprises the first kind of basic cells 31a and 31b which have substantially the same structure as the first kind of basic cells 11a and 11b and which are formed on an n-type semiconductor substrate 36 and on a p-type well 37, respectively. The basic cell unit further comprises the second kind of basic cells 32a and 32b. The second kind of basic cell 32a comprises a vertical npn-type transistor portion 34a, which is formed on an n-type substrate 36 and has substantially the same structure as the second kind of basic cell 12a shown in FIG. 5A. The second kind of basic cell 32a further comprises additional gate electrodes 33a formed between the transistor portion 34a and the adjacent first kind of basic cells 31a, and on the n-type substrate 36 via an insulation layer, e.g. SiO$_2$ (not shown). The second kind of basic cell 32b comprises a vertical pnp-type transistor portion 34b, which is formed on a p-type well 37 and has substantially the same structure as the second kind of basic cell 12b shown in FIG. 5A. The second kind of basic cell 32b further comprises additional gate electrodes 33b formed between the transistor portion 34b and the adjacent first kind of basic cells 31b, and on the p-type substrate 37 via an insulation layer, e.g. SiO$_2$ (not shown). The number of the first kind of basic cells 31a and 31b and of the second kind of basic cells 32a and 32b included in one basic cell unit can be freely determined. In FIGS. 7A, 7B, and 7C, the shaded areas designate n-type semiconductor regions, and the small circles designate contact points or holes.

As shown by an equivalent circuit of FIG. 7C, the first kind of basic cells 31a and 31b comprises two p-type MIS transistors and two n-type MIS transistors, respectively. The second kind of basic cells 32a comprises an npn-type bipolar transistor and two p-channel MIS transistors each being composed of an additional gate 33a, p-type base region of the npn-type bipolar transistor, and adjacent p-type diffusion region of the basic cell 31a. The second kind of basic cells 32b comprises a pnp-type bipolar transistor and two n-channel MIS transistors. Each of the p-channel MIS transistors of the second kind of basic cell 32a and each of the n-channel MIS transistors of the second kind of basic cell 32b are used as control transistors for connecting or disconnecting between the basic cells 31a and 32a and between the basic cells 31b and 32b.

In the above-mentioned basic cell unit, the ratio of MIS transistors and bipolar transistors included in one basic cell unit can be freely determined in accordance with the kind of circuits formed by using these transistors, performance requirements, and so on. However, usually, the number of MIS transistors including those in the second kind of basic cells should be more than double the number of bipolar transistors, and the bipolar buffers should be used only when the fan-out number is larger than the predetermined number and/or the length of the output connection lines is longer than the predetermined length.

Figure 8A:
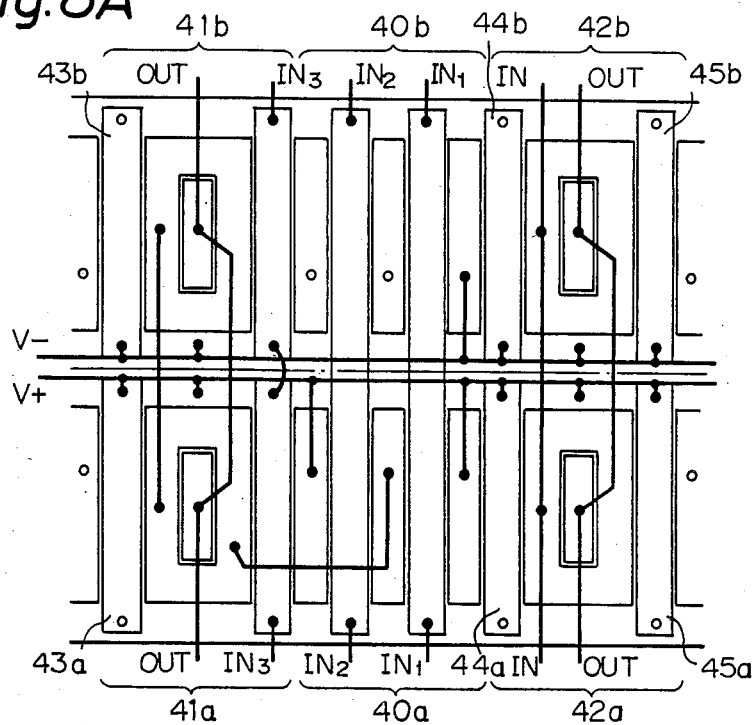
FIGS. 8A and 8B are a plan view and electric circuit diagram of an example of connections of the basic cell unit shown in FIG. 7B.
Figure 8B:
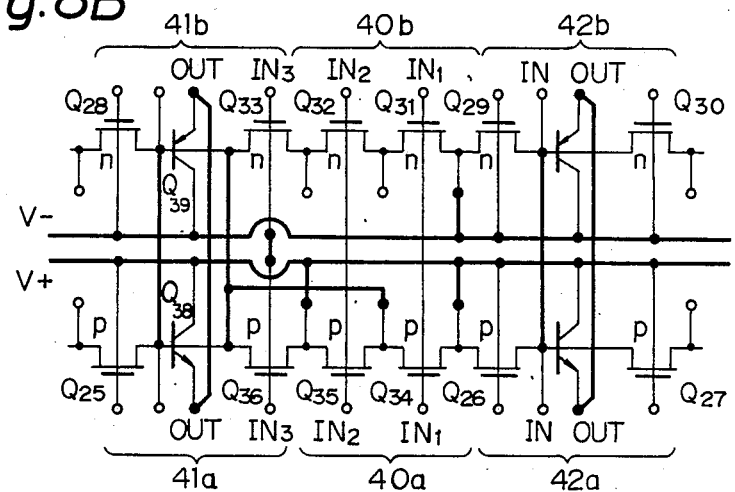

FIG. 8A illustrates an example of connections of the basic cell unit shown in FIG. 7B, and FIG. 8B is an equivalent circuit of the device of FIG. 8A. In FIG. 8A, the first kind of basic cells 40a and 40b and the second kind of basic cells 41a and 41b are used to constitute a three-input NAND gate having an output bipolar buffer circuit. In another array, the second kind of basic cells 42a and 42b are used to constitute a bipolar buffer circuit. In these drawings, the thick solid lines show aluminum conductor lines. A control gate electrode 43a of the second kind of basic cell 41a and control gate electrodes 44a and 45a of the second kind of basic cell 42a are connected to a positive power supply voltage V+, so that a transistor $Q_{25}$ of the basic cell 41a and transistors $Q_{26}$ and $Q_{27}$ of the basic cell 42a are all turned off. A control gate electrode 43b of the second kind of basic cell 41b and control gate electrodes 44b and 45b and the second kind of basic cell 42b are connected to a negative power supply voltage V−, thereby turning off a transistor $Q_{28}$ of the second kind of basic cell 41b and transistors $Q_{29}$ and $Q_{30}$ of the second kind of basic cell 42b. Therefore, each of the three-input NAND gates composed of the basic cells 40a, 41a, 40b, and 41b, and the bipolar buffer circuit composed of the basic cells 42a and 42b, is isolated from the other circuits.

Figure 9:
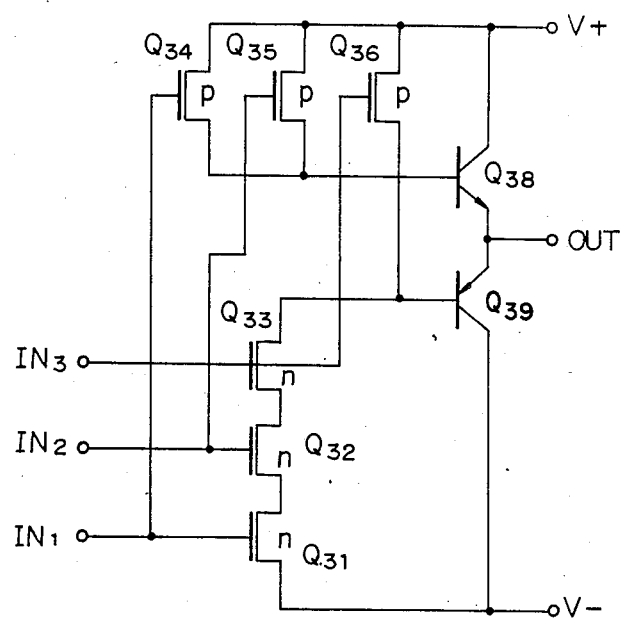
FIG. 9 is an electric circuit diagram of a circuit obtained by the connections shown in FIGS. 8A and 8B.

FIG. 9 is a clarified circuit diagram of the three-input NAND gate having the output bipolar buffer circuit shown in FIG. 8B and composed of the basic cells 40a, 41a, 40b, and 41b. In the circuit of FIG. 9, three serially connected n-channel MS transistors $Q_{31}$, $Q_{32}$, and $Q_{33}$ are in the basic cells 40b and 41b, and three parallely connected p-channel MOS transistors $Q_{34}$, $Q_{35}$, and $Q_{36}$ are in the basic cells 40a and 41a.

The circuit of FIG. 9 operates as a NAND gate because the output signal OUT becomes low only when all the input signals $IN_1$, $IN_2$, and $IN_3$ are high. That is, when all the input signals $IN_1$, $IN_2$, and $IN_3$ are high, the n-channel transistors $Q_{31}$, $Q_{32}$, and $Q_{33}$ are all turned on and the p-channel transistors $Q_{34}$, $Q_{35}$ and $Q_{36}$ are all turned off, so that the output signal OUT becomes low. When at least one of the input signals $IN_1$, $IN_2$, and $I_3$ is low, at least one of the p-channel transistors $Q_{34}$, $Q_{35}$, and $Q_{36}$ is turned on, thereby rendering the output signal OUT high.

As mentioned above, according to the present invention, since a plurality of kinds of circuits having different drive ability can be used as basic cells, it is possible to greatly increase the degree of freedom in the circuit design of a gate array LSI device and to surely and reliably prevent the operating speed from being decreased by the lack of drive ability, thereby realizing a high performance LSI device. Moreover, according to the present invention, since circuits having a larger drive ability are used only for portions necessitating a large drive ability, it is possible to avoid unnecessary power consumption and to increase the degree of integration of the circuits.

According to the present invention, it is also possible to select the coupling or to separate each bipolar buffer portion to or from CMIS circuit portions via control transistors which are turned on and off by using a master slice technique. Therefore, the bipolar buffer portion can be used with the adjacent CMIS circuit portion or portions, or can be used independently, so that the degree of freedom of circuit design is further increased.

I claim:

1. A master slice integrated circuit device comprising:
   a basic cell array portion disposed at an inner area of a semiconductor chip; and
   a plurality of input/output cells arranged at the periphery of said basic cell array portion and effecting signal transmission to and from external circuits;
   said basic cell array portion having a plurality of first basic cells each comprising a p-type MIS transistor and an n-type MIS transistor, said first basic cells being divided into at least four blocks, and a plurality of second basic cells each comprising a pnp-type bipolar transistor and an npn-type bipolar transistor, said second basic cells being arranged between said four blocks, wherein connections between said blocks of first basic cells may be made via said second basic cells.

2. A master slice integrated circuit device according to claim 1, wherein said p-type MIS transistor and said n-type MIS transistor of said first basic cell are used to form a CMIS logic circuit, and said pnp-type bipolar transistor and said npn-type bipolar transistor are used to form a bipolar buffer circuit.

3. A master slice integrated circuit device comprising:
   a basic cell array portion disposed at an inner area of a semiconductor chip; and
   a plurality of input/output cells arranged at the periphery of said basic cell array portion and effecting signal transmission to and from external circuits;
   said basic cell array portion having a plurality of first basic cells each comprising a p-type MIS transistor and an n-type MIS transistor, and a plurality of second basic cells each comprising a pnp-type bipolar transistor and an npn-type bipolar transistor, and said basic cell array portion being formed as a matrix of a plurality of basic cell units each comprising a combination of said first basic cells and said second basic cells each said second basic cell having a pair of first basic cells disposed adjacent thereto on opposite sides thereof.

4. A master slice integrated circuit device comprising:
a basic cell array portion disposed at an inner area of a semiconductor chip; and
a plurality of input/output cells arranged at the periphery of said basic cell array portion and effecting signal transmission to and from external circuits;
said basic cell array portion having a plurality of first basic cells each comprising a p-type MIS transistor and an n-type MIS transistor, and a plurality of second basic cells each comprising a pnp-type bipolar transistor and an npn-type bipolar transistor, said second basic cells being disposed in a cross-shaped array so that said second basic cells divide said plurality of first basic cells into four blocks of first basic cells, whereby connections between said blocks of first basic cells may be made via said second basic cells.

5. A master slice integrated circuit device according to claim 4, wherein said p-type MIS transistor and said n-type MIS transistor of said first basic cell are used to form a CMIS logic circuit, and said pnp-type bipolar transistor and said npn-type bipolar transistor are used to form a bipolar buffer circuit.

6. A master slice integrated circuit device, comprising:
a basic cell array portion disposed at an inner area of a semiconductor chip; and
a plurality of input/output cells arranged at the periphery of said basic cell array portion and effecting signal transmission to and from external circuits;
said basic cell array portion having a plurality of basic cell units disposed in an array, wherein each of said basic cell units comprises an n-type semiconductor region and a p-type semiconductor region formed adjacent to said n-type semiconductor region, on said n-type semiconductor region being formed an npn-type bipolar transistor and p-channel MIS transistor next to said npn-type bipolar transistor, on said p-type semiconductor region being formed on a pnp-type bipolar transistor and n-channel MIS transistors next to said pnp-type bipolar transistor and adjacent to said p-channel MIS transistors, said npn-type bipolar transistor and p-channel MIS transistors being aligned parallel to said pnp-type bipolar transistor and n-channel MIS transistors, said npn-type bipolar transistor being adjacent to said pnp-type bipolar transistor, said p-channel MIS transistors and adjacent n-channel MIS transistors having common gate electrodes.

7. A master slice integrated circuit device according to claim 6, wherein each of said basic cell units further comprises:
n-channel MIS control transistors each having control gates thereof formed between a base region of said pnp-type bipolar transistor and diffusion regions of said n-channel MIS transistors adjacent said pnp-type bipolar transistor; and
p-channel MIS control transistors each having control gates thereof formed between a base region of said npn-type bipolar transistor and diffusion regions of said p-channel MIS transistors adjacent said npn-type bipolar transistor, the control gates of said n-channel MIS control transistors and the control gates of said p-channel MIS control transistors being separate from each other and for being supplied with power supply voltages or signal voltages.

8. A master slice integrated circuit device according to claim 6 or 7, wherein each of said pnp-type bipolar transistors and said npn-type bipolar transistors is a vertical type transistor.

9. A master slice integrated circuit device comprising:
a basic cell array portion disposed at an inner area of a semiconductor chip; and
a plurality of input/output cells arranged at the periphery of said basic cell array portion and effecting signal transmission to and from external circuits;
said basic cell array portion having a plurality of basic cell units disposed in an array, wherein each of said basis cell units comprises
an n-type semiconductor region, and a p-type semiconductor region formed adjacent to said n-type semiconductor region;
a plurality of p-channel MIS transistors formed on said n-type semiconductor region and each having a gate electrode for being supplied with a signal voltage;
a plurality of n-channel MIS transistors formed on said p-type semiconductor region and each being adjacent a corresponding one of said p-channel MIS transistors formed on said n-type semiconductor region, each n-channel MIS transistor having a gate electrode for being supplied with a signal voltage, each of said n-channel MIS transistors having its gate electrode formed in common with the gate electrode of its corresponding adjacent p-channel MIS transistor;
first transistors formed on said n-type semiconductor region adjacent to and on opposite sides of each of said p-channel MIS transistors, said first transistors being npn-type bipolar transistors;
second transistors formed on said p-type semiconductor region adjacent to and on opposite sides of each of said n-channel MIS transistors, said second transistors being pnp-type bipolar transistors;
p-channel MIS control transistors formed on said n-type semiconductor region between said p-channel MIS transistors and said first transistors adjacent thereto, each said p-channel MIS control transistor having a control gate electrode formed between one of said p-channel MIS transistors and one of said first transistors adjacent thereto, and drain and source regions formed by commonly using a diffusion region of said p-channel MIS transistor adjacent to said control gate electrode and a p-type region of said first transistor adjacent to said control gate electrode; and
n-channel MIS control transistors formed on said p-type semiconductor region between said n-channel MIS transistors and said second transistors adjacent thereto, each said n-channel MIS control transistor having a control gate electrode formed between one of said n-channel MIS transistors and one of said second transistors adjacent thereto, and drain and source regions formed by commonly using a diffusion region of said n-channel MIS transistor adjacent to said control gate electrode and an n-type region of said second transistor adjacent to said control gate electrode;

each said p-channel MIS control transistor functioning to isolate its adjacent p-channel MIS transistor and first transistor from each other upon application of a positive power supply voltage to said control gate electrode thereof, and each said n-channel MIS control transistor functioning to isolate its adjacent n-channel MIS transistor and second transistor from each other upon application of a negative power supply voltage to said control gate electrode thereof; and each said p-channel MIS control transistor and n-channel MIS control transistor functioning as a logic circuit transistor upon application of a signal voltage to the respective control gate electrode thereof.

* * * * *